(12) United States Patent
Badarinarayan et al.

(10) Patent No.: US 7,508,682 B2
(45) Date of Patent: Mar. 24, 2009

(54) HOUSING FOR AN ELECTRONIC CIRCUIT

(75) Inventors: Harsha Badarinarayan, Farmington Hills, MI (US); Kazutaka Okamoto, Novi, MI (US); Frank Hunt, West Bloomfield, MI (US)

(73) Assignee: Hitachi, Ltd., Tokyo (JP)

( * ) Notice: Subject to any disclaimer, the term of this patent is extended or adjusted under 35 U.S.C. 154(b) by 425 days.

(21) Appl. No.: 11/230,099

(22) Filed: Sep. 19, 2005

(65) Prior Publication Data

US 2007/0064403 A1    Mar. 22, 2007

(51) Int. Cl.
H05K 7/14 (2006.01)
H05K 7/18 (2006.01)

(52) U.S. Cl. .................. 361/797; 361/800; 361/752

(58) Field of Classification Search ............. 361/790, 361/797, 800, 737, 727; 312/223
See application file for complete search history.

(56) References Cited

U.S. PATENT DOCUMENTS

| | | | |
|---|---|---|---|
| 3,973,477 A | 8/1976 | Jakob et al. ............... 97/1 |
| 4,980,786 A * | 12/1990 | O'Sullivan et al. ....... 360/97.03 |
| 5,208,732 A * | 5/1993 | Baudouin et al. ............ 361/704 |
| 5,276,418 A * | 1/1994 | Klosowiak et al. .......... 335/202 |
| 5,460,317 A | 10/1995 | Thomas et al. ............ 228/112.1 |
| 5,485,350 A | 1/1996 | Hecht et al. .................. 361/692 |
| 5,872,332 A | 2/1999 | Verma ....................... 174/35 C |
| 6,051,325 A * | 4/2000 | Talwar et al. ................ 428/593 |
| 6,101,950 A * | 8/2000 | Kothe .......................... 102/530 |
| 6,305,866 B1 | 10/2001 | Aota et al. .................. 402/270 |
| 6,572,007 B1 | 6/2003 | Stevenson et al. ......... 228/112.1 |
| 6,588,647 B2 | 7/2003 | Yamada et al. ............ 228/112.1 |
| 6,594,149 B2 | 7/2003 | Yamada et al. .............. 361/699 |
| 6,604,667 B2 | 8/2003 | Schilling et al. ............. 228/2.1 |
| 6,640,414 B2 | 11/2003 | Stevenson et al. ........ 29/525.14 |
| 6,751,096 B2 | 6/2004 | Aldon ......................... 361/695 |
| 6,772,935 B2 | 8/2004 | Scheglmann et al. ...... 228/112.1 |
| 6,816,377 B2 | 11/2004 | Itabashi et al. .............. 361/704 |
| 6,933,057 B2 * | 8/2005 | Young et al. ................. 428/593 |
| 6,972,959 B2 * | 12/2005 | Asai et al. .................... 361/719 |
| 2005/0035174 A1 | 2/2005 | Hidaka et al. | |

FOREIGN PATENT DOCUMENTS

| | | |
|---|---|---|
| JP | 2004051035 A | 2/2004 |
| JP | 2004230412 A | 8/2004 |
| JP | 2004255420 A | 9/2004 |
| JP | 2005011673 A | 1/2005 |
| JP | 2005028378 A | 2/2005 |
| JP | 2005028421 A | 2/2005 |
| JP | 2005034907 A | 2/2005 |

* cited by examiner

*Primary Examiner*—Hung S Bui
(74) *Attorney, Agent, or Firm*—Gifford, Krass, Sprinkle, Anderson & Citkowski, P.C.

(57) ABSTRACT

A housing for an electrical circuit having a metal base with an open top and a metal lid which overlies the open top of the base and forms an interior chamber adapted to contain an electronic circuit. The outer periphery of the lid is attached to the base by friction stir welding to thereby form a hermetically sealed chamber dimensioned to contain an electronic circuit. An electronic port is electrically connected to the electronic circuit and accessible exteriorly of the housing.

20 Claims, 5 Drawing Sheets

HOUSING FOR AN ELECTRONIC CIRCUIT

BACKGROUND OF THE INVENTION

I. Field of the Invention

The present invention relates to a housing for an electronic circuit.

II. Description of Related Subject Matter

There are many applications in the automotive industry and elsewhere where it is necessary to encapsulate electronic circuits within metal housings to protect the electronic circuits not only from mechanical impact and debris, but also from electromagnetic interference (EMI). One such exemplary electronic circuit contained within a metal housing is illustrated in FIG. 1.

With reference then to FIG. 1, these previously known housings for electrical components typically comprise a metal base 20 having an open top 22. A metal lid 24 is then positioned over the base 20 to form an interior chamber 26 dimensioned to contain one or more electronic circuits 28.

In order to protect the electronic circuits from debris, moisture and the like, a resilient seal 30 is disposed between the base 20 and lid 24. The base 20 and lid 24 are then secured together by a plurality of fasteners 32, typically bolts, which ideally compress the seal 30 and prevent debris and moisture from entering into the chamber 26. After sealing the base 20 and lid 24 together, the electronic circuits 28 are electrically accessible through an electrical port 34 attached to the housing.

In practice, however, these previously known housings for electronic circuits have not proven wholly satisfactory in use. One disadvantage of these previously known housings is that the lid 24 and/or base 20 may deform slightly when the fasteners 32 are tightened. When this occurs, a gap may form between the seal 30 and either the base 20 or lid 24. Such a gap disadvantageously allows debris, moisture and the like to enter into the chamber 26 and damage the circuits 28.

A still further disadvantage of these previously known housings for electronic circuits is that foreign particles may accumulate in the area 36 adjacent the outer periphery of the seal 30. Such particles can, over time, corrode the base 20 and/or lid 24 and permit entry of debris, moisture and the like into the chamber 26. Furthermore, in automotive applications, road salt and water can accelerate such corrosion.

A still further disadvantage of these previously known housings is that a physical gap exists between the base 20 and lid 24 following assembly. This physical gap enables EMI to enter into the circuit chamber 26 and cause malfunction of certain circuits 28.

A still further disadvantage of these previously known housings for electronic circuits is that the fasteners 32, as well as the cost of assembling with the fasteners, appreciably increases both the overall cost and weight of the housing. Additionally, even when the fasteners 32 are properly tightened, some movement may still occur between the base 20 and lid 24. This movement can result in vibration between the base 20 and lid 24 and potential damage to the electronic circuits 28, particularly when the housing is subjected to harsh operating environments, such as the engine compartment of an automotive vehicle.

A still further disadvantage of these previously known housings for electronic circuits is that the lid 24 is separable from the base 20 by simply loosening the fasteners 32. This, in turn, allows tampering of the electronic circuits 28. Such tampering is highly undesirable in many situations, for example where the electronic circuit 28 contains odometer information stored in nonvolatile memory. Tampering of the circuits 28 would thus enable the memory to be altered to reflect a lower distance traveled by the vehicle.

SUMMARY OF THE PRESENT INVENTION

The present invention provides a housing for electronic circuits which overcomes all of the above-mentioned disadvantages of the previously known devices.

In brief, the housing for an electronic circuit of the present invention comprises a metal base having an open top. A metal lid overlies the open top of the base and forms an interior chamber which is dimensioned to receive an electronic circuit. The electronic circuit is electrically connected to an electrical port which in turn is accessible exteriorly of the housing.

The base and lid are secured together by friction stir welding to thereby hermetically seal the interior chamber of the electronic circuit and thus protect the electronic circuit from debris, moisture and the like. Since friction stir welding occurs at a lower temperature than conventional welding, appreciable heating of the housing chamber, and thus heating of the electronic circuit, is avoided. However, in order to further reduce the possibility of damage to the electronic circuits during the friction welding process, one or more chills are optionally applied to the sides and/or bottom of the housing during the friction stir welding operation. These chills, which are preferably liquid cooled, rapidly remove the heat created during the friction stir welding operation thus ensuring that the electronic circuit within the housing remains free from thermal damage.

Since the friction stir welding hermetically seals the base and the lid together, the interior chamber of the housing is completely protected from EMI. Furthermore, all vibration between the base and the lid is completely eliminated by friction stir welding as well as the material and assembly costs of the previously known fasteners and seals used to secure the housing parts together. The housing also is tamperproof following the stir welding operation.

BRIEF DESCRIPTION OF THE DRAWING

A better understanding of the present invention will be had upon reference to the following detailed description, when read in conjunction with the accompanying drawing, wherein like reference characters refer to like parts throughout the several views, and in which.

DETAILED DESCRIPTION OF PREFERRED EMBODIMENTS OF THE PRESENT INVENTION

Figure 1:
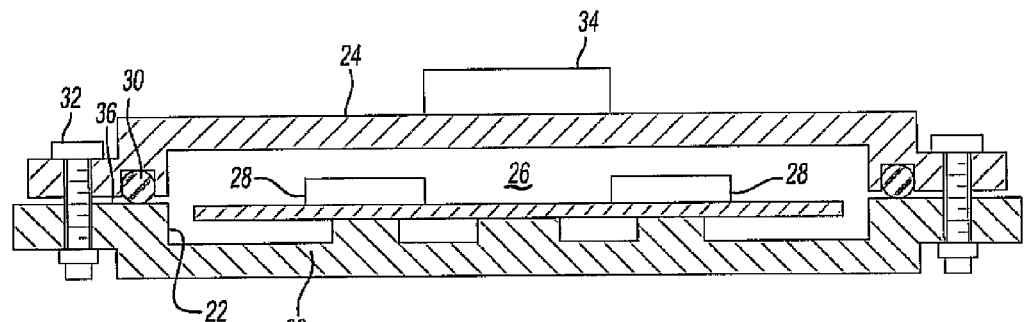
FIG. 1 is a sectional view illustrating a prior art housing design.
Figure 2:
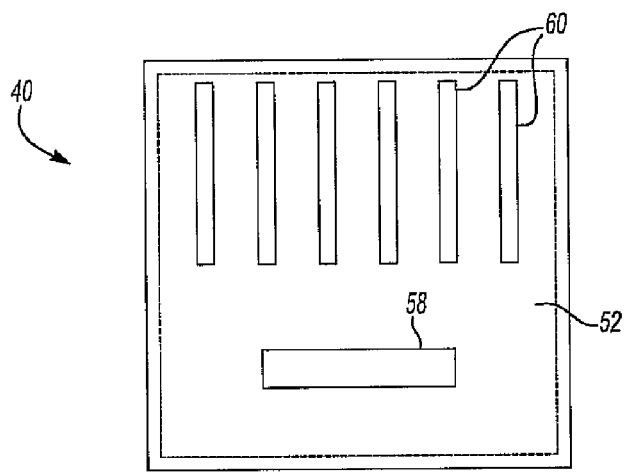
FIG. 2 is a top plan view illustrating a preferred embodiment of the invention.
Figure 3:
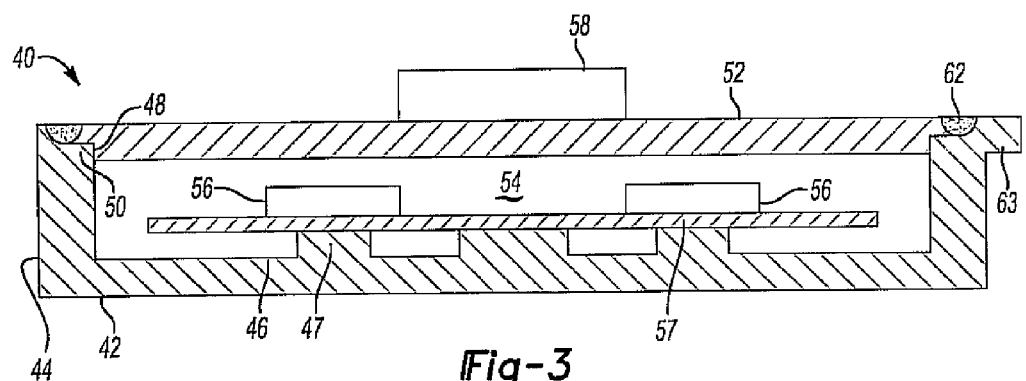
FIG. 3 is a sectional view of the preferred embodiment of the invention.

With reference first to FIGS. 2 and 3, a preferred embodiment of a housing 40 of the present invention is shown. The housing 40 includes a metal base 42 having at least one sidewall 44 and a bottom 46. The base 42 is constructed of any suitable material, such as aluminum, steel, magnesium, and the like.

The base 42, furthermore, includes an open top 48. Additionally, an outwardly facing support ledge 50 is provided on the sidewalls 42 around the open top of the lid 48.

The housing 40 further includes a lid 52 constructed of a metal material and preferably the same material as the base 42. The lid 52, furthermore, is dimensioned to flatly abut against the base ledge 50 and, in doing so, form an interior chamber 54. This interior chamber 54 is dimensioned to contain one or more electronic circuits 56.

The circuit(s) 56 are mounted to a circuit board 57 which, in turn, is both mechanically and thermally connected to the housing base 42 by one or more chip mounts 47. The chip mounts 47, during operation of the circuit 56, dissipate heat from the circuit 56 to the housing base 42 and are preferably integral with the base 42.

Still referring to FIGS. 2 and 3, at least one of the electronic circuits is electrically connected to an electrical port 58 which is accessible exteriorly of the housing 40. The port 58 is illustrated in FIGS. 2 and 3 as positioned on the lid 52 but may alternatively be positioned on the base 42. Likewise, although only one port 58 is shown in FIGS. 2 and 3, two or even more ports may be provided on the housing 40 as required. The housing also optionally includes cooling fins 60 (FIG. 2).

Figure 4:
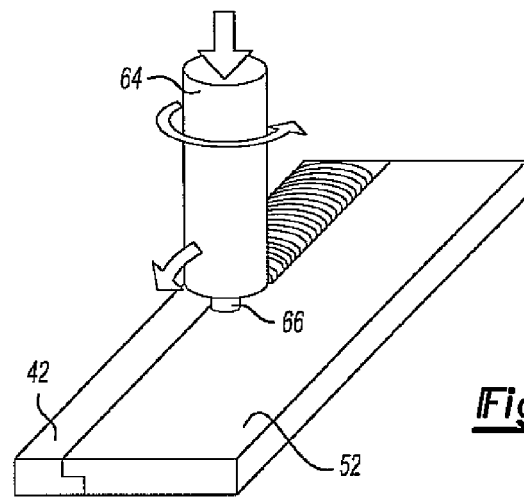
FIG. 4 is a diagrammatic view illustrating a friction stir welding operation.

With reference now to FIGS. 3 and 4, the base 42 and lid 52 are hermetically sealed together by friction stir welding which forms a friction stir weld 62 around the entire periphery of the lid 52 and base 42. A diagrammatic illustration of friction stir welding is shown in FIG. 4 in which a rotating cylindrical tool 64 having a threaded pin 66 at one end is plunged into the butt joint between the lid 52 and the base 42. A downward force is applied on the tool 64 which creates friction heating in the lid 52 and base 42 while the rotating tool 64 is linearly displaced around the outer periphery of the lid 52 and base 42 thus performing the friction stir weld 62. Furthermore, although the housing 40 depicted in FIGS. 2-4 only requires that the tool 64 be linearly displaced along two axes in a single plane during the friction stir welding operation, simultaneous displacement of the friction stir tool 64 along two or even three axes may be required depending upon the overall shape of the housing 40. Friction stir welding can also be used to spot weld the lid and base together.

Although the lid 52 is illustrated in FIG. 3 as flat, it may assume any desired shape and may be formed in any conventional manner, such as by stamping or die casting.

Preferably, the housing 40 includes an outwardly protruding run off/on tab 63 aligned with the lid 52. The friction stir weld is both initiated and terminated in the tab 63.

Figure 5:
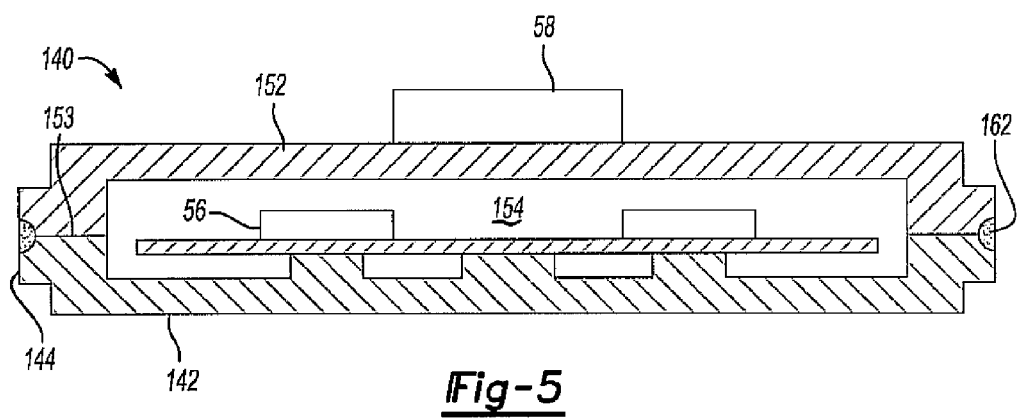
FIG. 5 is a view illustrating a second preferred embodiment of the present invention.

With reference now to FIG. 5, a modification of the housing 140 is shown in which a lid 152 flat abuts against a base 144 so that a seam 153 between the lid 152 and base 142 is open to a side 144 of the housing 140, rather than the top as shown in FIG. 3. In this case, a friction stir weld 162 is formed around the sides 144 of the housing 140 thus creating a hermetically sealed chamber 154 containing the electrical circuits 56. As before, these circuits 56 are accessible electrically through an electrical port 58 on the outside of the housing 140.

Figure 6:
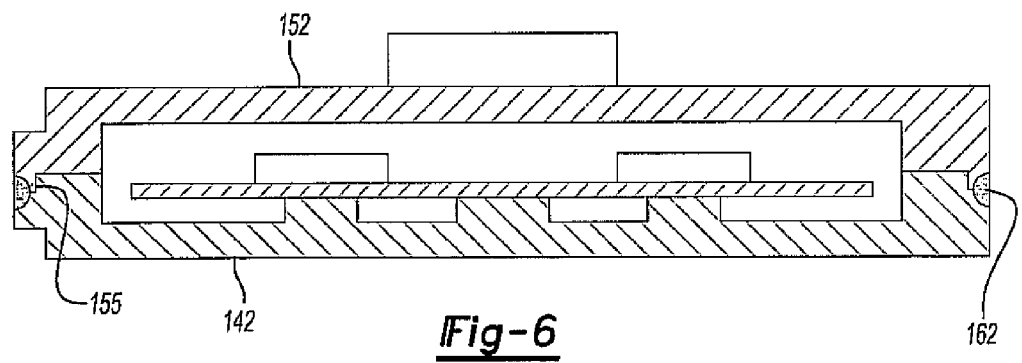
FIG. 6 is a view similar to FIG. 5 but illustrating a modification thereof.

With reference now to FIG. 6, a modification of the housing illustrated in FIG. 5 is shown in which a lap joint 155 is formed between the lid 152 and base 142. The lap joint 155 is advantageous in certain situations in that it ensures automatic centering of the lid 152 onto the base 142 during assembly.

Figure 7:
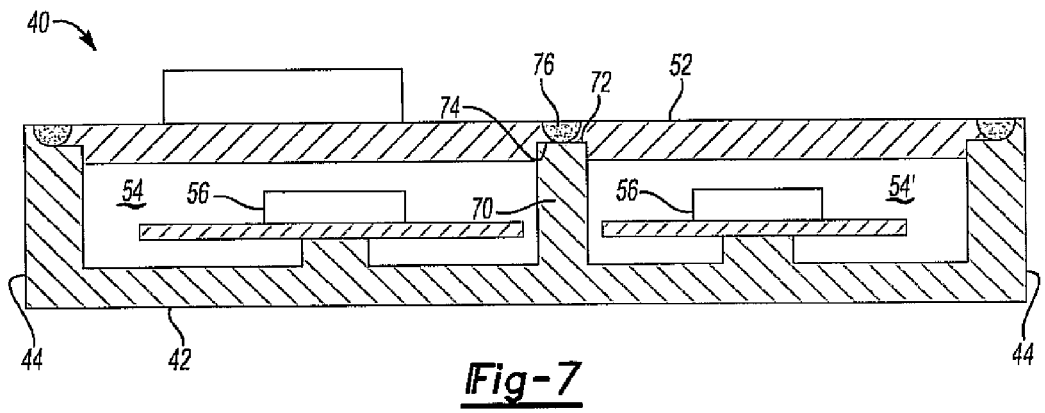
FIG. 7 is a view similar to FIG. 3 but illustrating a modification thereof.

With reference now to FIG. 7, a still further modification of the present invention is shown in which the base 42 includes a separating wall 70 between two of its sidewalls 44. A top 72 of the separating wall 70 is contained within a groove 74 formed in the lid 52 and thus forms a lap joint between the separator wall 70 and the lid 52. The lap joint between the lid 52 and separator wall 70 as well as the butt joints around the outer periphery of the lid 52 and sidewalls 44 are then secured together by friction stir welding thus performing a friction stir weld 76 between the lid 52 and separator wall 70.

The use of a separator wall 70 as illustrated in FIG. 7 may be desirable in situations where the overall housing 40 is large so that additional support between the base 42 and lid 52 is necessary or at least desirable. Additionally, the use of the separator wall 70 enables the separator wall 70 to form two distinct hermetically sealed chambers 54 and 54' each containing its own electronic circuit 56 and 56', respectively. Such separation of the circuits 56 and 56' may be desirable in a situation where EMI shielding between the circuits 56 and 56' is desirable.

The lid in FIG. 7 may also be of a single or multi-piece construction.

Figure 8:
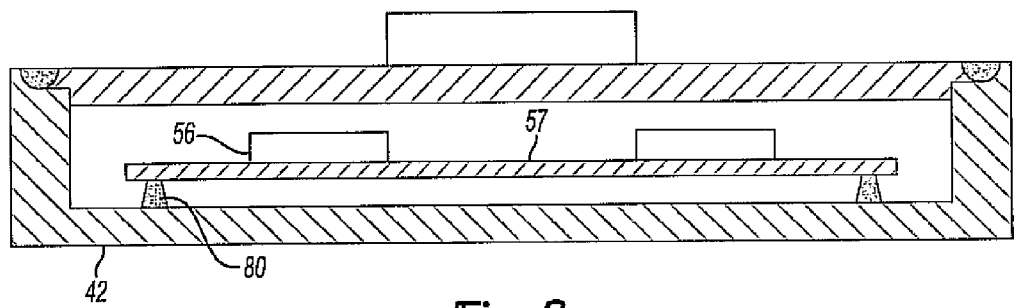
FIG. 8 is a view similar to FIG. 3 but illustrating a modification thereof.

With reference now to FIG. 8, a still further modification of the present invention is shown in which one or more thermal isolators 80 is provided between the electronic circuit 56 and the base 42. In practice, the thermal isolator(s), which may be constructed of any conventional material such as ceramic, facilitates isolation of the heat generated during the friction stir welding from the electronic circuits 56. For example, the electronic circuits 56 may be mounted on a printed circuit board 57 which in turn is supported by the thermal isolator(s) 80.

Figure 9:
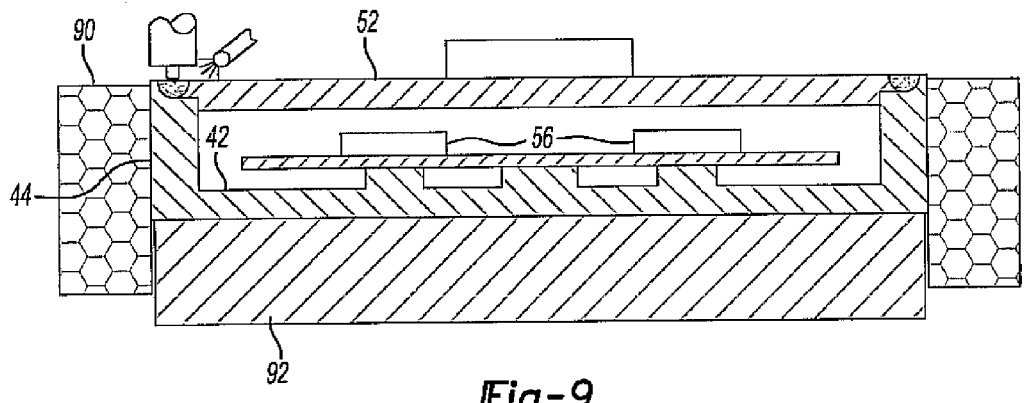
FIG. 9 is a view similar to FIG. 3 but further illustrating a cooling mechanism during the stir welding operation.

With reference now to FIG. 9, in some cases it may be desirable to protect the electronic circuits 56 from even the relatively minor heat generated during the friction stir welding operation. In this event, a chill 90, preferably made of copper for its high thermal conductivity, is positioned in thermally conductive contact with one or more of the base sidewalls 44 while the base 42, in turn, is supported on an anvil 92. Each chill 90 includes at least one fluid passage through which a cooling fluid, preferably a cooling liquid, passes. Consequently, during the stir welding operation, heat generated by the friction stir welding is dissipated by the chill 90.

Figure 10:
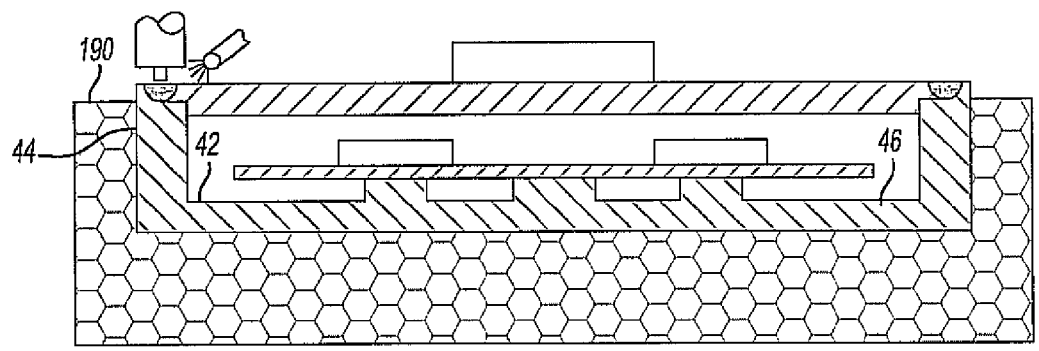
FIG. 10 is a view similar to FIG. 9 but illustrating a modification thereof.

A modification to the invention illustrated in FIG. 9 is shown in FIG. 10. FIG. 10 differs from FIG. 9 in that a chill 190 extends around not only a portion of the sidewalls 44, but also at least a portion of the bottom 46 of the housing base 42. The additional surface area contact between the chill 190 and the housing base 42 further facilitates the dissipation of heat from the base 42 during the friction stir welding operation.

Figure 11:
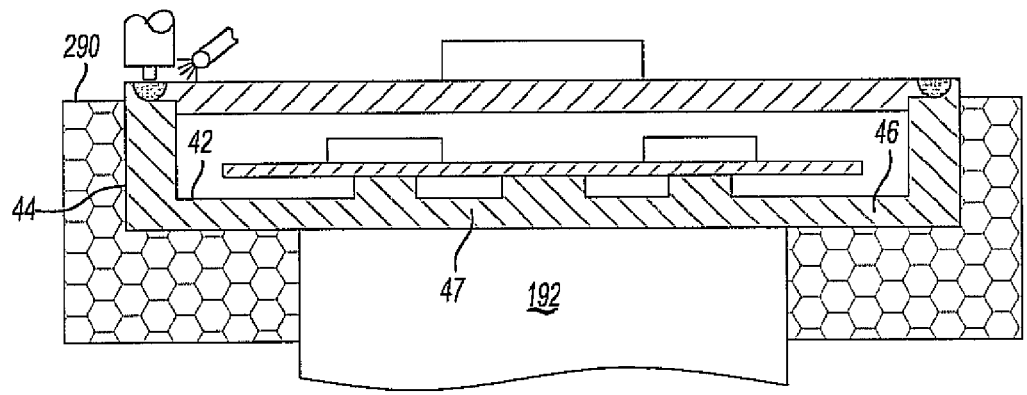
FIG. 11 is a view similar to FIG. 9 but illustrating a modification thereof.

A still further modification to the invention is shown in FIG. 11 in which a chill 290 is thermally positioned in contact with the base around its sidewalls 44 but only a portion of the bottom 46 of the base 42. A central portion 47 of the base bottom 46 remains exposed and may be supported by an anvil 162 during the friction stir welding operation.

Figure 12:
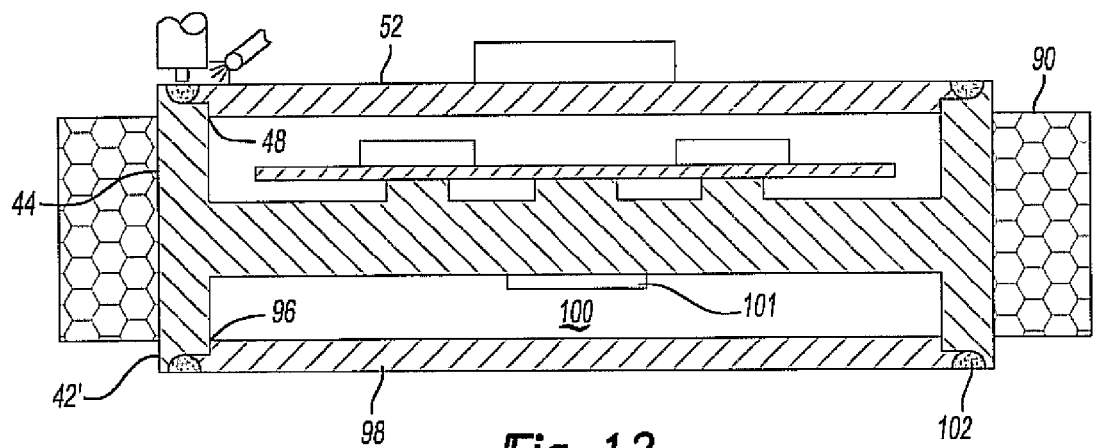
FIG. 12 is a view similar to FIG. 9 but illustrating a modification thereof.

With reference now to FIG. 12, a still further modification of the present invention is there shown in which the housing base is open not only at its top 48, but also its bottom 96. The bottom 96 is then covered by a bottom cover 98 which overlies and covers the open bottom 96 of the housing base 42'. In doing so, the base 98 forms a second interior housing chamber 100. This housing chamber 100 is hermetically sealed to the housing base 42' by friction stir welds 102 around the outer periphery of the bottom 98. Appropriate chills 90 are optionally used to cool the housing sidewalls 44 during the friction stir welding operation.

A separate electronic circuit 101 may be housed in the chamber 100. Alternatively, a fluid coolant, either gaseous or liquid, may be contained within or flow through the chamber 100 in applications where additional cooling is required.

Figure 14:
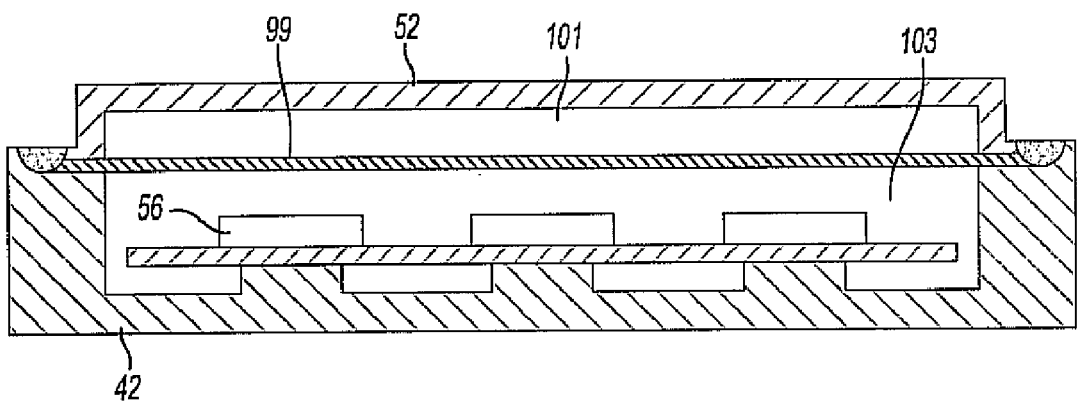
FIG. 14 is a view similar to FIG. 12, but illustrating a modification thereof.

With reference to FIG. 14, a still further modification of the invention is illustrated in which a metal separator wall 99 is positioned between the lid 52 and base 42 thus forming two housing cavities 101 and 103. The circuits 56 are contained in the housing chamber 103 while the other housing chamber may contain a coolant, form a coolant passage and/or contain other circuits. The lid 52 is also illustrated in FIG. 14 as a die cast lid.

Figure 13:
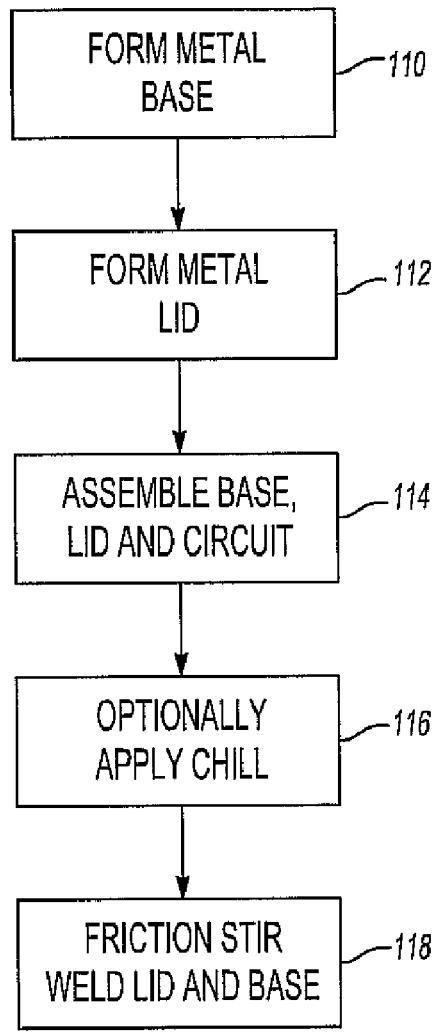
FIG. 13 is a process flowchart illustrating the present invention.

With reference now to FIG. 13, the method of the present invention is summarized for clarity. At step 110 the metal base is formed and at step 112 the metal lid is formed such that the lid is complementary to the base. It does not matter whether step 110 occurs before step 112 or vice versa.

At step 114 the electronic circuit is mounted within the base and the lid is assembled to the base so that the electronic circuit is contained within a housing chamber formed between the base and the lid. One or more chills are then optionally applied to the assembled base and lid at step 116 and the base and lid are finally secured together by friction stir welding at step 118.

From the foregoing, it can be seen that the present invention provides a simple and yet highly advantageous housing for an electric circuit which overcomes all of the above-mentioned disadvantages of the previously known devices. In particular, since the friction stir welding operation hermetically seals the lid to the base in a continuous weld, and optionally also hermetically seals the bottom to the base, the contamination of the interior housing compartments containing the electronic circuit by debris and moisture is completely prevented. Furthermore, the continuous weld is formed at relatively low temperatures which do not harm even temperature sensitive electronic components.

The present invention is particularly advantageous when used in automotive applications, such as a housing for the electronic control unit (ECU), traction control unit (TCU) and the like where the housing is subjected to vibration, EMI and corrosive chemicals.

A still further advantage of the present invention over the previously known housings is that the present invention eliminates both the weight and cost of the previously known fasteners and seals oftentimes used in automotive applications to secure the housing base and lid together. Additionally, the friction weld between the housing base and lid, and optionally the housing base and bottom, also provides a unitary construction which not only eliminates vibration between the housing base and lid, but also eliminates all passageways for EMI to enter into the interior of the housing. The housing is also tamper evident, i.e. the circuits cannot be directly accessed without destroying, or at least visibly altering, the appearance of the housing.

Having described my invention, however, many modifications thereto will become apparent to those skilled in the art to which it pertains without deviation from the spirit of the invention as defined by the scope of the appended claims.

We claim:

1. A housing comprising:
    a metal base having an open top and forming a chamber, an electronic circuit positioned in said chamber,
    a metal lid overlying said open top of said base so that said electronic circuit is entirely contained in said chamber between said metal base and said metal lid and so that an outer periphery of said metal base flatly abuts against an outer periphery of said metal lid, said lid being attached to said base continuously around said outer periphery of said lid and said outer periphery of said base by a friction stir weld to thereby hermetically seal said chamber containing said electronic circuit,
    an electrical port electrically connected to said electronic circuit and accessible exteriorly of the housing; and
    wherein said base includes a support ledge around said open top of said base, said lid having an outer peripheral portion abutment with and supported by said ledge.

2. The invention as defined in claim 1 wherein said base includes a plurality of opposed sidewalls and comprising an intermediate wall extending between two sidewalls of said base, said lid abutting against and secured to said intermediate wall by friction stir welding.

3. The invention as defined in claim 1 and comprising a thermal isolator disposed between said base and the electronic circuit.

4. The invention as defined in claim 1 and comprising a separator wall sandwiched between said lid and said base and secured to said base and said lid by said friction stir weld.

5. The invention as defined in claim 1 wherein said base comprises a bottom and side walls extending outwardly from said bottom.

6. A method for constructing a housing comprising the steps of:
    forming a metal base having an open top and defining a chamber,
    placing an electronic circuit in said chamber,
    forming a metal lid dimensioned to overlie and cover said open top of said base and said chamber and so that an outer periphery of said lid flatly abuts against an outer periphery of said housing,
    friction stir welding said lid to said base continuously around said outer periphery of said lid and said outer periphery of said base, to thereby hermetically seal said electronic circuit in said chamber,
    providing an electrical port electrically connected with the electronic circuit and accessible exteriorly of the housing; and
    forming said base includes a support ledge around said open top of said, said lid having an outer peripheral portion abutment with and supported by said ledge.

7. The invention as defined in claim 6 wherein said base has at least one sidewall and a bottom and further comprising the step of cooling at least a portion of the sidewall during said welding step.

8. The invention as defined in claim 7 and further comprising the step of cooling at least a portion of the bottom during said welding step.

9. The invention as defined in claim 8 and wherein said step of cooling at least a portion of the bottom during said welding step further comprises the step of cooling the entire bottom during said welding step.

10. The invention as defined in claim 7 wherein said cooling step comprises the step of placing a chill having an internal fluid passageway in contact with the sidewall and flowing a coolant through the fluid passageway.

11. The invention as defined in claim 10 wherein said coolant comprises a liquid.

12. A housing comprising:
   a metal base having an open top and an open bottom for an electronic circuit and forming a first chamber,
   a first electronic circuit positioned in said chamber,
   a metal lid overlying said open top of said base so that said electronic circuit is entirely contained in said first chamber between said metal base and said metal lid and so that an outer periphery of said metal base flatly abuts against an upper outer periphery of said metal lid, said lid being attached to said base by a friction stir weld continuously around said upper outer periphery of the lid to thereby form a hermetically sealed chamber containing said first electronic circuit,
   a metal bottom overlying said open bottom of said base and forming a second chamber between said metal bottom and said metal base, a second electronic circuit positioned in said second chamber, said bottom having an outer periphery which flatly abuts against a lower outer periphery of said metal base around said bottom, said bottom being attached to said base by a friction stir weld continuously around said lower outer periphery to thereby hermetically seal said second electronic circuit in said second chamber,
   an electrical port electrically connected to at least one of said first and second electronic circuit and accessible exteriorly of the housing.

13. The invention as defined in claim 12 wherein said base includes a support ledge around said open top of said base, said lid having an outer peripheral portion in abutment with and supported by said ledge.

14. The invention as defined in claim 13 wherein said base includes a plurality of opposed sidewalls and comprising an intermediate wall extending between two sidewalls of said base, said lid abutting against and secured to said intermediate wall by friction stir welding.

15. The invention as defined in claim 12 wherein said base includes a support ledge around said open bottom of said base, said bottom having an outer peripheral portion in abutment with and supported by said ledge.

16. The invention as defined in claim 12 wherein one of said electronic circuits comprises a circuit for an automotive vehicle.

17. The invention as defined in claim 16 wherein one of said circuits comprises an electronic control unit (ECU) for the vehicle.

18. The invention as defined in claim 12 and comprising a second electronic circuit contained in said second housing chamber.

19. The invention as defined in claim 18 wherein said second chamber is hermetically sealed.

20. The invention as defined in claim 12 and comprising a fluid coolant in said second housing chamber.

* * * * *